(12) United States Patent
Pan

(10) Patent No.: US 10,345,640 B2
(45) Date of Patent: Jul. 9, 2019

(54) LIQUID CRYSTAL DISPLAY DEVICE AND COLOR FILTER SUBSTRATE OF THE SAME

(71) Applicant: Wuhan China Star Optoelectronics Technology Co., Ltd., Wuhan, Hubei (CN)

(72) Inventor: Biao Pan, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 283 days.

(21) Appl. No.: 15/328,445

(22) PCT Filed: Dec. 29, 2016

(86) PCT No.: PCT/CN2016/113072
§ 371 (c)(1),
(2) Date: Jan. 23, 2017

(87) PCT Pub. No.: WO2018/119894
PCT Pub. Date: Jul. 5, 2018

(65) Prior Publication Data
US 2018/0292705 A1  Oct. 11, 2018

(30) Foreign Application Priority Data

Dec. 27, 2016 (CN) .......................... 2016 1 1228299

(51) Int. Cl.
*G02F 1/1335* (2006.01)
*C09B 57/00* (2006.01)
(Continued)

(52) U.S. Cl.
CPC ...... *G02F 1/133514* (2013.01); *C09B 23/107* (2013.01); *C09B 29/34* (2013.01);
(Continued)

(58) Field of Classification Search
CPC . G03F 7/0007; G02B 5/223; G02F 1/133514; G02F 1/133516
(Continued)

(56) References Cited

U.S. PATENT DOCUMENTS

2016/0004125 A1*  1/2016  Li ......................... C09K 19/56
252/512

FOREIGN PATENT DOCUMENTS

CN       H10332926 A     12/1998
CN       101231466 A      7/2008
(Continued)

*Primary Examiner* — John A McPherson
(74) *Attorney, Agent, or Firm* — Andrew C. Cheng

(57) ABSTRACT

A color filter substrate is disclosed, including a substrate, a black matrix disposed on the substrate and multiple color resist blocks separated by the black matrix and disposed on the substrate. Each color resist block is filled with a color resist material, the color resist material includes pigment molecules, including at least one photosensitive substituent. A liquid crystal display device having the same is also disclosed. Utilizing an UV irradiation step in the CF process, the pigment molecules are aligned directionally, which can increase the transmittance of the color filter substrate, the utilization rate of the backlight, and decrease the power consumption. Under the same display brightness, the thickness of the color filter substrate can be decreased; the pigment molecules aligned directionally can make an emitting light to be along a same direction to reduce the light interference between adjacent sub-pixels having different colors to greatly decrease the color shift.

7 Claims, 3 Drawing Sheets

(51) Int. Cl.
    *C09B 29/34*     (2006.01)
    *C09B 23/10*     (2006.01)
    *G02B 5/22*     (2006.01)
    *G03F 7/00*     (2006.01)

(52) U.S. Cl.
    CPC .............. *C09B 57/00* (2013.01); *G02B 5/223* (2013.01); *G02F 1/133512* (2013.01); *G02F 1/133617* (2013.01); *G03F 7/0007* (2013.01)

(58) Field of Classification Search
    USPC .............................................. 430/7; 349/106
    See application file for complete search history.

(56) References Cited

FOREIGN PATENT DOCUMENTS

| | | |
|---|---|---|
| CN | 103676331 A | 3/2014 |
| CN | 104765187 A | 7/2015 |
| CN | 105867039 A | 8/2016 |
| CN | 105892143 A | 8/2016 |

* cited by examiner

LIQUID CRYSTAL DISPLAY DEVICE AND COLOR FILTER SUBSTRATE OF THE SAME

BACKGROUND OF THE INVENTION

1. Field of the Invention

The present invention relates to liquid crystal display technology field, and more particularly to a color filter substrate and a liquid crystal display device having the color filter substrate.

2. Description of Related Art

In a liquid crystal display technology using an additive color method of three primary colors of red, green and blue, a color liquid crystal display device generally includes a backlight module, a liquid crystal cell and a color filter substrate stacked sequentially. The backlight module can emit a white light. After the white light transmits through the liquid crystal cell, the white light enters into each color resist (that is, red color resist, green color resist and blue color resist). After the white light enter a corresponding color resist, the white light is filtered to become a emitted light corresponding to the color resist.

The color resist usually adopted an organic pigment, which is a mixture of varies dispersants and resins, and the molecules of the pigment is under a dispersed state and an arrangement of the molecules is irregular. Accordingly, when a polarized light passing through, the color filter substrate 100 using the above pigment is as shown in FIG. 1. When the polarized light having a definite direction passing through the color filter substrate 100, an emergent direction of the polarized light is messy.

In order to increase the light transmittance of the color resist and decrease a color shift phenomenon because of the light leakage near the sub-pixel, the alignment direction of the molecules of the pigment in the color resist should be unified.

SUMMARY OF THE INVENTION

In order to solve the problem existed in the conventional art, the present invention provides a color filter substrate, the color filter substrate utilizes an ultraviolet-light irradiation step in the CF process, and disposes a photosensitive substituent in the pigment molecules such that the pigment molecules in the color filter substrate are aligned directionally under the irradiation of the ultraviolet light so that the color filter substrate has a high transmittance and low color shift.

In order to achieve the above invention purpose, the present invention adopts the following technology solution:

a color filter substrate, comprising: a substrate; a black matrix disposed on the substrate; and multiple color resist blocks separated by the black matrix and disposed on the substrate, each color resist block is filled with a color resist material, the color resist material includes pigment molecules, and the pigment molecules include at least one photosensitive substituent.

Furthermore, the photosensitive substituent makes the pigment molecules to be aligned directionally under a function of an ultraviolet light.

Furthermore, a wavelength of the ultraviolet light is in a range of 250 nm~370 nm.

Furthermore, the photosensitive substituent carries out a photoisomerization reaction, a photolysis reaction or a photodimerization reaction under a function of an ultraviolet light.

Furthermore, the photosensitive substituent has a structural formula as following formula (1), formula (2) or formula (3):

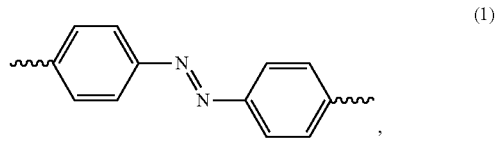

(1)

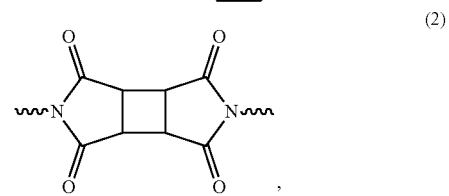

(2)

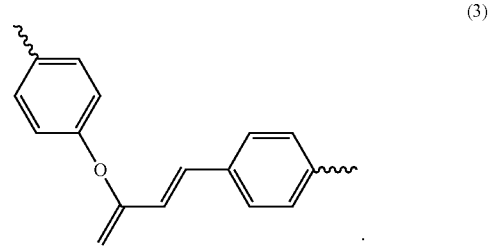

(3)

Furthermore, the multiple color resist blocks include a red color resist block, a green color resist block and a blue color resist block.

Furthermore, the multiple color resist blocks are sequentially ranged as the red color resist block, the green color resist block and the blue color resist block.

Another purpose of the present invention is to provide a liquid crystal display device, comprising a liquid crystal panel and a backlight module disposed oppositely, wherein, the backlight module provides a display light source to the liquid crystal panel such that the liquid crystal panel displays an image; the liquid crystal panel includes a color filter substrate as described above.

Utilizing an UV irradiation step in the CF process, the pigment molecules in the color filter substrate are aligned directionally in order to obtain an excellent color filter substrate. The color filter substrate can be applied in the liquid crystal display device, having following beneficial effects:

(1) the pigment molecules aligned directionally can increase the transmittance of the color filter substrate, the utilization rate of the backlight, and decrease the power consumption;

(2) under a same display brightness, the thickness of the color filter substrate can be decreased for thinning the module;

(3) the pigment molecules aligned directionally can make an emitting light emitted from the color filter substrate to be along a same direction to reduce the light interference between adjacent sub-pixels having different colors to greatly decrease the color shift.

BRIEF DESCRIPTION OF THE DRAWINGS

Through following to combine figures to describe in detail, the above, the other purposes, the features and benefits of the exemplary embodiment of the present disclosure will become clearer, in the figures.

DETAILED DESCRIPTION OF THE PREFERRED EMBODIMENT

The following content combines with the drawings and the embodiment for describing the present invention in detail. However, many other forms can be used to implement the present invention. Besides, the present invention should not be interpreted to be limit in the specific embodiment described here. On the contrary, the embodiments provided here are used for explaining the operation principle and practical application such that person skilled in the art can under various embodiments of the present invention and various modification suitable for specific applications. In the figures, in order to illustrate the devices clearly, size and shape of the elements are enlarged. A same numeral in the entire specification and figures represents a same device.

Embodiment 1

Figure 1:
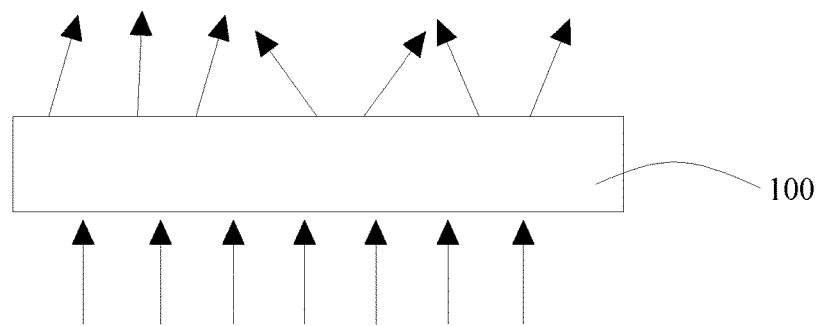
FIG. 1 is a schematic diagram of light path of a color filter substrate when a polarized light passing through according to the prior art.
Figure 2:
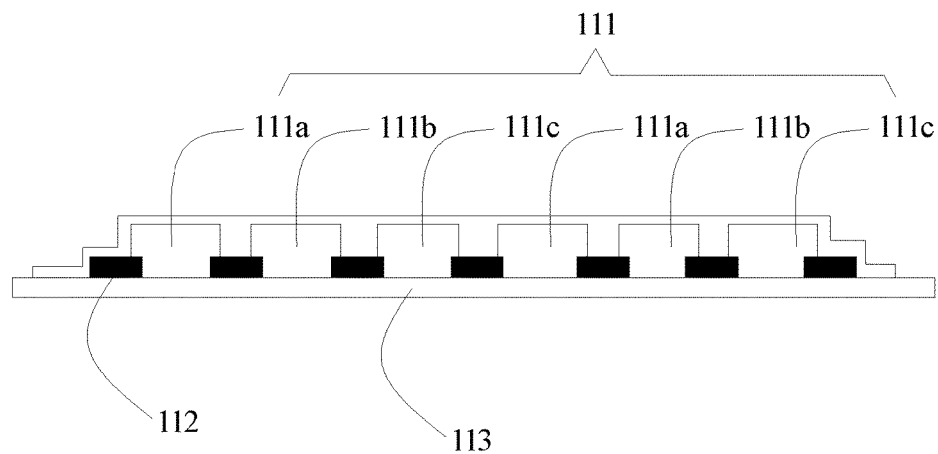
FIG. 2 is a schematic structural diagram of a color filter substrate according to an embodiment 1 of the present invention.

FIG. 2 is a schematic structural diagram of a color filter substrate according to an embodiment 1 of the present invention.

With reference to FIG. 2, a color filter substrate includes a substrate 111, a black matrix 112 disposed on the substrate 111, multiple color resist blocks 113 separated by the black matrix 112 and disposed on the substrate 111. Each color resist block 113 is filled with a color resist material, and the color resist material includes pigment molecules. The pigment molecules include at least one photosensitive substituent.

Specifically, the photosensitive substituent will carry out a chemical reaction under an irradiation of an ultraviolet light such that the pigment molecules will be aligned directionally.

In the present embodiment, photosensitive substituent carries out a photoisomerization reaction under the function of the ultraviolet light, and the photosensitive substituent has a structure as following formula (1):

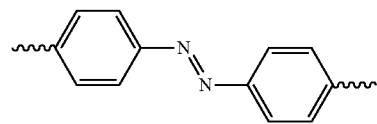

Except the pigment molecules, the color resist material further comprises other components such as dispersants and resins. The dispersants and resins are used for spreading out the pigment molecules, and no more repeating here, one of ordinary skilled in the art can refer to the conventional art.

Figure 3:
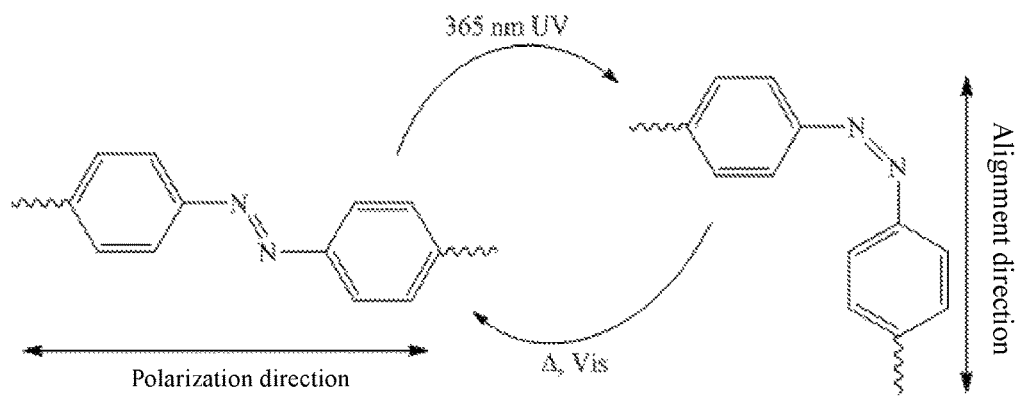
FIG. 3 is a schematic diagram of a photoisomerization reaction process of the pigment molecules in the color filter substrate according to an embodiment 1 of the present invention.

Therefore, after using the pigment molecules having the photosensitive substituent to manufacture the color filter substrate, when using an ultraviolet light having a wavelength of 365 nm to irradiate the color filter substrate, the photosensitive substituent carries out a photoisomerization reaction such that pigment molecules are directionally aligned along one direction, as shown in FIG. 3.

In the present embodiment, the multiple color resist blocks 113 includes a red color resist block 113a, a green color resist block 113b and a blue color resist block 113c having equal amount. Besides, the color resist blocks 113 are sequentially ranged as the red color resist block 113a, the green color resist block 113b and the blue color resist block 113c.

Preferably, sizes of the red color resist block 113a, the green color resist block 113b and the blue color resist block 113c are equal.

Figure 4:
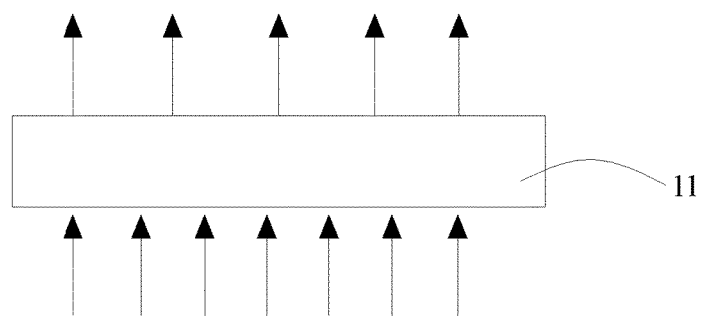
FIG. 4 is a schematic diagram of light path of a color filter substrate when a polarized light passing through according to an embodiment 1 of the present invention.

For the color filter substrate 11 obtained by the present embodiment, when a polarized light having a definite direction passing through the color filter substrate, the pigment molecules aligned directionally can make a an emergent direction of the polarized light to keep in the same direction. Preferably, the emergent direction of the polarized light is perpendicular to the substrate 111, as shown in FIG. 4.

Embodiment 2

In the description of the embodiment 2, the same portion as the embodiment 1 is not repeated again. The difference comparing to the embodiment 1 is illustrated. The difference between the embodiment 2 and the embodiment 1 is that the photosensitive substituent carries out a photolysis reaction under the function of the ultraviolet light, and the photosensitive substituent has a structure as a following formula (2):

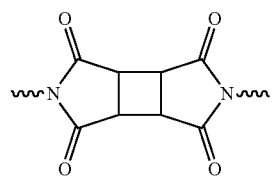

Figure 5:
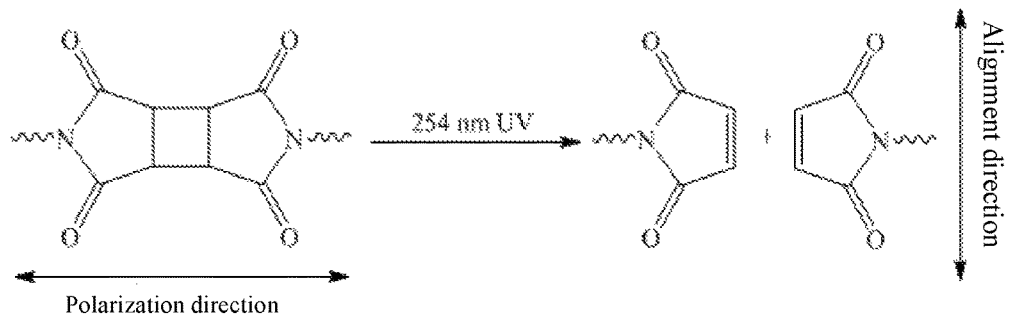
FIG. 5 is a schematic diagram of a photolysis reaction process of the pigment molecules in the color filter substrate according to an embodiment 2 of the present invention.

Therefore, after using pigment molecules having the above photosensitive substituent to manufacture the color filter substrate, when using an ultraviolet light having a wavelength of 254 nm to irradiate the color filter substrate, the photosensitive substituent carries out a photolysis reaction such that the pigment molecules are directionally aligned along one direction, as shown in FIG. 5.

Embodiment 3

In the description of the embodiment 3, the same portion as the embodiment 1 is not repeated again. The difference comparing to the embodiment 1 is illustrated. The difference between the embodiment 3 and the embodiment 1 is that the photosensitive substituent carries out a photodimerization reaction under the function of the ultraviolet light, and the photosensitive substituent has a structure as a following formula (3):

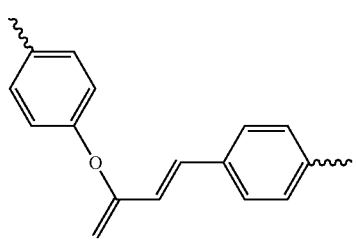

(3)

Figure 6:
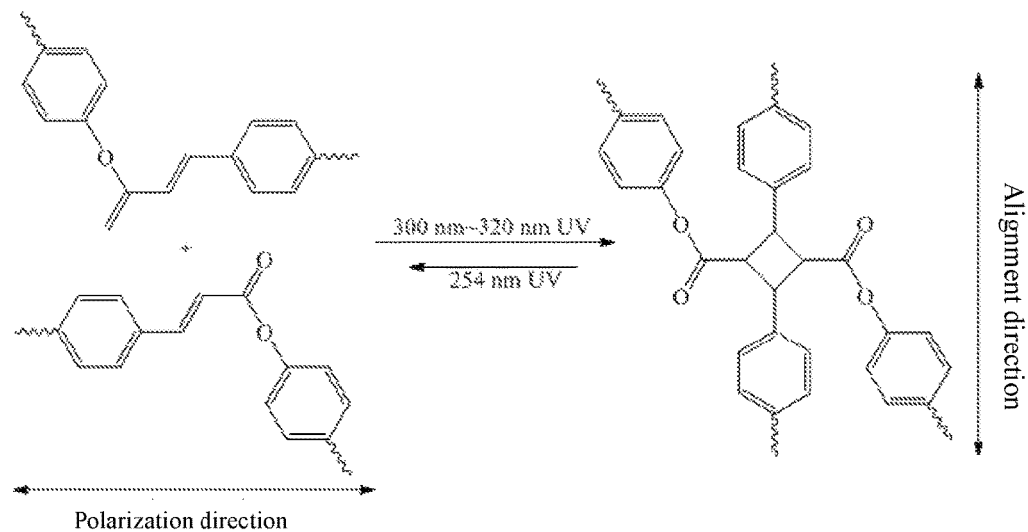
FIG. 6 is a schematic diagram of a photodimerization reaction of the pigment molecules in the color filter substrate according to an embodiment 3 of the present invention.

Therefore, after using the pigment molecules having the above photosensitive substituent to manufacture the color filter substrate, when using an ultraviolet light having a wavelength in a range of 300 nm-320 nm, preferably 313 nm to irradiate the color filter substrate, the photosensitive substituent carries out the photodimerization reaction such that the pigment molecules are directionally aligned along one direction, as shown in FIG. 6.

Embodiment 4

Figure 7:
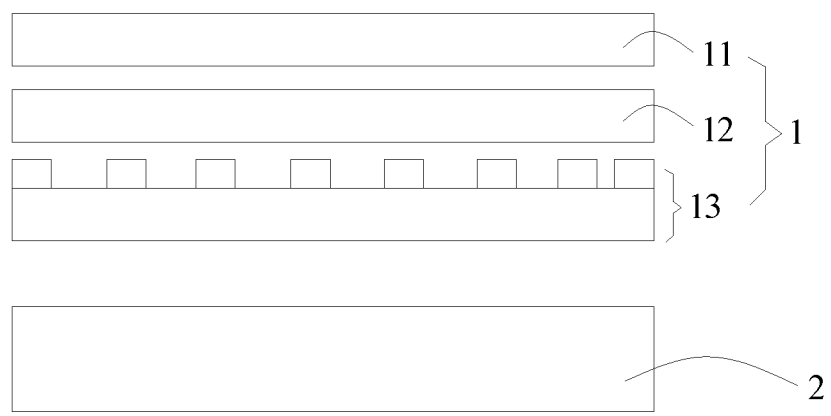
FIG. 7 is a schematic diagram of a liquid crystal display device according to an embodiment 4 of the present invention.

The present embodiment provides a liquid crystal display device, as shown in FIG. 7, the liquid crystal display device includes a liquid crystal panel 1 and a backlight module 2 disposed oppositely. The backlight module 2 provides a display light source to the liquid crystal panel 1 such that the liquid crystal panel 1 displays an image.

Wherein, the liquid crystal panel 1 further includes a thin-film transistor array 13 and liquid crystal layer 12 along a direction away from the backlight module 2, and the color filter substrate 11 in the embodiment 1 to embodiment 3.

The liquid crystal display device has many advantages of thin thickness, high transmittance and low color shift in a large viewing angle.

The above content combines the embodiments to describe the present invention, however, the implement of the present invention is not limited. Within the spirit and scope of present invention, the person in this technology field can perform various modifications and variations. The modifications and variations are still covered by the claims in the present invention.

What is claimed is:

1. A liquid crystal display device, comprising:
a liquid crystal panel and a backlight module disposed oppositely, wherein, the backlight module provides a display light source to the liquid crystal panel such that the liquid crystal panel displays an image; wherein, the liquid crystal panel includes a thin-film transistor array, a liquid crystal layer and a color filter substrate along a direction away from the backlight module, wherein the color filter substrate comprises:
a substrate disposed above the liquid crystal layer;
a black matrix disposed on the substrate; and
multiple color resist blocks separated by the black matrix and disposed on the substrate, each color resist block is filled with a color resist material, the color resist material includes pigment molecules, and the pigment molecules include at least one photosensitive substituent;
wherein the multiple color resist blocks are separated from the liquid crystal layer by the substrate; and
wherein emergent directions of polarized lights emitted from the color filter substrate are the same.

2. The liquid crystal display device according to claim 1, wherein, the photosensitive substituent in the pigment molecules of the color filter substrate makes the pigment molecules to be aligned directionally under a function of an ultraviolet light.

3. The liquid crystal display device according to claim 2, wherein, a wavelength of the ultraviolet light is in a range of 250 nm~370 nm.

4. The liquid crystal display device according to claim 2, wherein, the photosensitive substituent carries out a photoisomerization reaction, a photolysis reaction or a photodimerization reaction under a function of an ultraviolet light.

5. The liquid crystal display device according to claim 4, wherein, photosensitive substituent has a structural formula as following formula (1), formula (2) or formula (3):

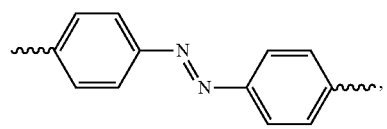

(1)

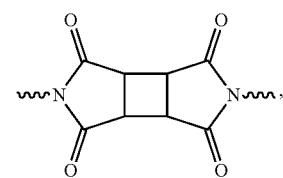

(2)

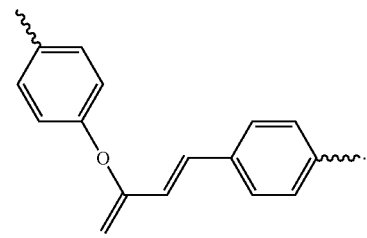

(3)

6. The liquid crystal display device according to claim 5, wherein, the multiple color resist blocks in the color filter substrate include a red color resist block, a green color resist block and a blue color resist block.

7. The liquid crystal display device according to claim 5, wherein, the multiple color resist blocks are sequentially ranged as the red color resist block, the green color resist block and the blue color resist block.

* * * * *